US010992276B2

(12) United States Patent
Holman et al.

(10) Patent No.: US 10,992,276 B2
(45) Date of Patent: Apr. 27, 2021

(54) METADATA FOR DUCKING CONTROL

(71) Applicant: Apple Inc., Cupertino, CA (US)

(72) Inventors: Tomlinson M. Holman, Cupertino, CA (US); Frank M. Baumgarte, Sunnyvale, CA (US); Eric A. Allamanche, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/269,866

(22) Filed: Feb. 7, 2019

(65) Prior Publication Data

US 2019/0181822 A1  Jun. 13, 2019

Related U.S. Application Data

(63) Continuation of application No. 15/595,792, filed on May 15, 2017, now Pat. No. 10,224,894, which is a
(Continued)

(51) Int. Cl.
*H03G 3/30* (2006.01)
*G10L 19/008* (2013.01)
(Continued)

(52) U.S. Cl.
CPC ......... *H03G 3/3089* (2013.01); *G10L 19/008* (2013.01); *H04N 21/4396* (2013.01);
(Continued)

(58) Field of Classification Search
CPC .......................... H03G 3/3089; G10L 19/008; H04N 21/4396; H04N 21/8106; H04R 27/02; H04R 2227/003; H04R 2227/009
(Continued)

(56) References Cited

U.S. PATENT DOCUMENTS 9,171,549 B2 * 10/2015 Hoffmann ............. G10L 19/008
2012/0201386 A1 8/2012 Riedmiller et al.
(Continued)

FOREIGN PATENT DOCUMENTS

CN  101917660 A  12/2010
CN  102576562 A  7/2012
(Continued)

OTHER PUBLICATIONS

Chinese Office Action with English translation, Chinese Application No. 201580006201.5, dated Sep. 20, 2019.
(Continued)

*Primary Examiner* — Jason R Kurr
(74) *Attorney, Agent, or Firm* — Womble Bond Dickinson (US) LLP

(57) ABSTRACT

An audio encoding device and an audio decoding device are described herein. The audio encoding device may examine a set of audio channels/channel groups representing a piece of sound program content and produce a set of ducking values to associate with one of the channels/channel groups. During playback of the piece of sound program content, the ducking values may be applied to all other channels/channel groups. Application of these ducking values may cause (1) the reduction in dynamic range of ducked channels/channel groups and/or (2) movement of channels/channel groups in the sound field. This ducking may improve intelligibility of audio in the non-ducked channel/channel group. For instance, a narration channel/channel group may be more clearly heard by listeners through the use of selective ducking of other channels/channel groups during playback.

20 Claims, 4 Drawing Sheets

Related U.S. Application Data continuation of application No. 14/613,203, filed on Feb. 3, 2015, now Pat. No. 9,654,076.

(60) Provisional application No. 61/970,284, filed on Mar. 25, 2014.

(51) Int. Cl.
*H04N 21/439* (2011.01)
*H04N 21/81* (2011.01)
*H04R 27/02* (2006.01)

(52) U.S. Cl.
CPC ......... *H04N 21/8106* (2013.01); *H04R 27/02* (2013.01); *H04R 2227/003* (2013.01); *H04R 2227/009* (2013.01)

(58) Field of Classification Search
USPC .................. 381/22, 23, 80, 104, 106, 107
See application file for complete search history.

(56) References Cited

U.S. PATENT DOCUMENTS

2012/0237005 A1* 9/2012 Ho ..................... H04H 60/04 379/67.1
2014/0025389 A1 1/2014 Hoffmann

FOREIGN PATENT DOCUMENTS

| CN | 102792374 A | 11/2012 |
|---|---|---|
| CN | 103443854 A | 12/2013 |
| JP | 2010528335 | 8/2010 |
| JP | 2012070137 | 4/2012 |
| JP | 2013521541 | 6/2013 |
| WO | 2011044153 | 4/2011 |
| WO | 2012138594 | 10/2012 |

OTHER PUBLICATIONS

Information technology MPEG audio technologies Part 4: Dynamic range control; ISO/IEC JTC 1/SC 29/WG 11; 2014; 67 Pages.
Summary Page: Information technology MPEG audio technologies Part 4: Dynamic range control; ISO/IEC JTC 1/SC 29/WG 11; 2014; 1 Pages.
Chinese Office Action dated Mar. 25, 2019 for related Chinese Appln. No. 201580006201.5 14 Pages.
Australian Examination Report dated Mar. 17, 2020, Australian Application No. 2019201701, 3 pages.
Chinese Rejection Decision and English translation dated Feb. 6, 2020, Chinese Application No. 201580006201.5, 47 pages.
Notice of Reasons for Refusal for Japanese Application No. 2019-189850 dated Dec. 24, 2020, 7 pages.

* cited by examiner

METADATA FOR DUCKING CONTROL

RELATED MATTERS

This application is a continuation of U.S. patent application Ser. No. 15/595,792, which is a continuation of U.S. patent application Ser. No. 14/613,203, filed Feb. 3, 2015, now U.S. Pat. No. 9,654,076, which claims the benefit of the earlier filing date of U.S. provisional application No. 61/970,284, filed Mar. 25, 2014, which are incorporated herein by reference in their entirety.

FIELD

A system and method are described for adding ducking values into an audio asset representing a piece of sound program content. The ducking values may be associated with a particular channel/channel group and may be used for ducking every other channel/channel group in the piece of sound program content except for the associated channel/channel group. Other embodiments are also described.

BACKGROUND

An audio channel may be selectively toggled "on" and "off" by a listener. For example, a movie or television show may include a narration channel that may be selected by a user. The narration channel may provide audio descriptions of visual actions and activities taking place within a corresponding video. Accordingly, this narration channel may be beneficial to users that are visually impaired.

Although narration may allow a visually impaired user to better understand the visual actions and activities taking place in a video, directly playing this narration channel over other audio channels may compromise overall intelligibility of these channels. For example, main dialogue channels may interfere with narration channels when both of these channels are played simultaneously.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY

An audio encoding device and an audio decoding device are described herein. The audio encoding device may examine a set of audio channels corresponding to a piece of sound program content and produce a set of ducking values to associate with one of the channels or a channel group. For example, the audio channels may include a narration channel that assists visually impaired users to understand actions taking place in a movie or television broadcast. For instance, the narration channel may include an audio description of movement of characters in video or other actions that would not be evident to visually impaired users. The ducking values may be associated with this narration channel in an audio asset representing the encoded piece of sound program content.

The audio asset may be transferred to one or more audio decoding devices for playback through a set of loudspeakers. In one embodiment, the ducking values may reduce the dynamic range of all other channels apart from the narration channel in the piece of sound program content during playback. Accordingly, the narration channel may be emphasized through the reduction in range of the other channels being played back. In one embodiment, the ducking values may vary over time such that ducking is performed during periods in which activity is detected in the narration channel and not during periods of inactivity (e.g., voice/speech activity).

In some embodiments, ducking may be applied separately to audio channels/channel groups. For example, a dialogue channel may be more severely ducked than music/effects channels. This variability allows the improvement of intelligibility of a narration channel without the need to duck other channels that may not as harshly affect intelligibility of the narration channel.

In some embodiments, ducking values may also cause one or more channels not associated with the ducking values to be rendered at a different location within the sound field. For instance, ducking values may cause channels to be rendered by the surround loudspeakers during playback. Along with ducking and reducing the dynamic range of the channels, this modification of the rendering location may improve the intelligibility of another channel (e.g., a narration channel).

As described above, ducking values may be included in an encoded piece of sound program content and associated with a particular channel/channel group. During playback of the encoded piece of sound program content, the ducking values may be applied to all other channels/channel groups not associated with the ducking values. This ducking may improve intelligibility of audio in the non-ducked channel/channel group. For instance, as described above, a narration channel/channel group may be more clearly heard by listeners through the use of selective ducking of other channels/channel groups during playback.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments are described with reference to the appended drawings. While numerous details are set forth, it is understood that some embodiments of the invention may be practiced without these details. In other instances, well-known circuits, structures, and techniques have not been shown in detail so as not to obscure the understanding of this description.

Figure 1:
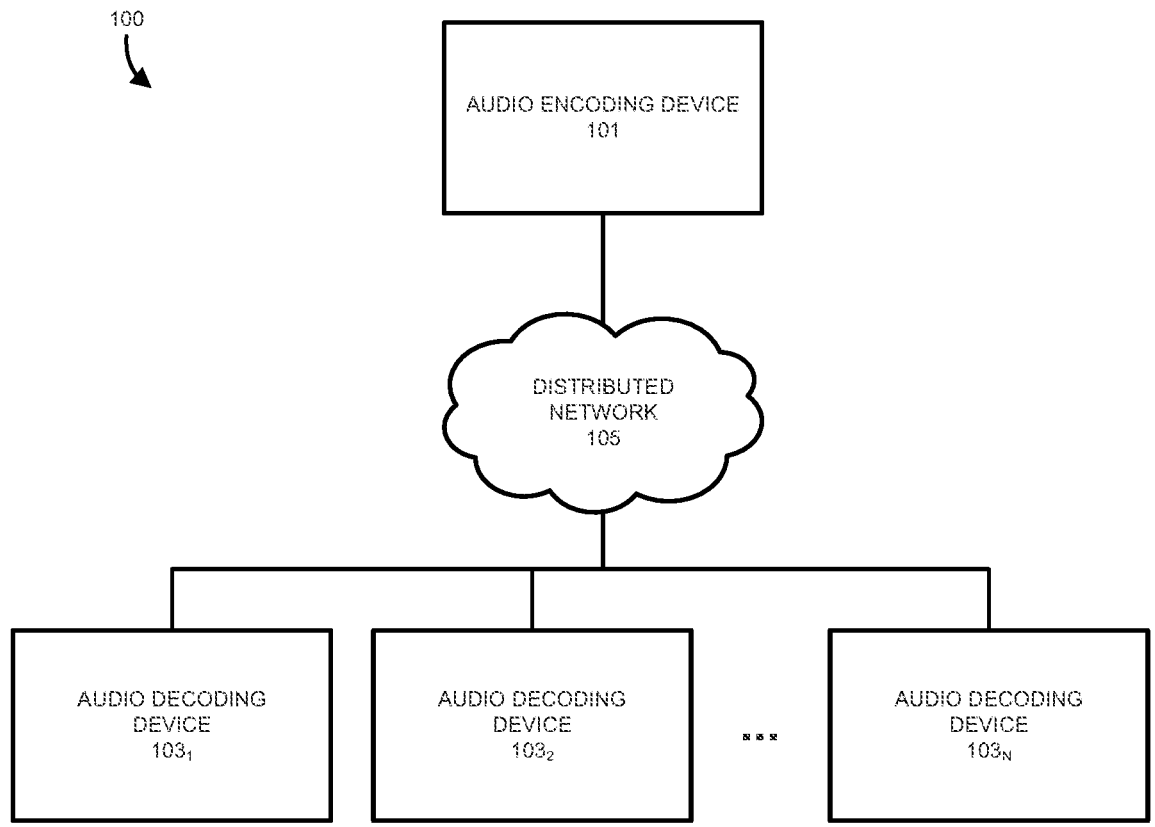
FIG. 1 shows an audio system, including an audio encoding device and a set of audio decoding devices, according to one embodiment.

FIG. 1 shows an audio system 100 according to one embodiment. The audio system 100 may include an audio encoding device 101 and a set of audio decoding devices $103_1$-$103_N$. The audio encoding device 101 and the audio decoding devices $103_1$-$103_N$ may be communicatively coupled through the distributed network 105. In particular, the audio encoding device 101 may encode one or more pieces of sound program content and transfer the encoded data to one or more of the audio decoding devices $103_1$-$103_N$ over the distributed network 105.

In one embodiment, the audio encoding device 101 may encode a multi-channel piece of sound program content. As will be described in greater detail below, the encoded data produced by the audio encoding device 101 may include metadata for separate channels or channel groups comprising the piece of sound program content. In particular, metadata for a particular channel/channel group may indicate that all other channels/channel groups should be "ducked" (i.e., reduced in intensity/volume) for a specified duration/period of time. This ducking may allow the channel/channel group that is not being ducked (i.e., channel/channel group associated with the ducking values) to be more clearly heard/understood by user/listeners.

Each element of the audio system 100 will now be described by way of example. In other embodiments, the audio system 100 may include more elements than those shown in FIG. 1 and described herein.

Figure 2:
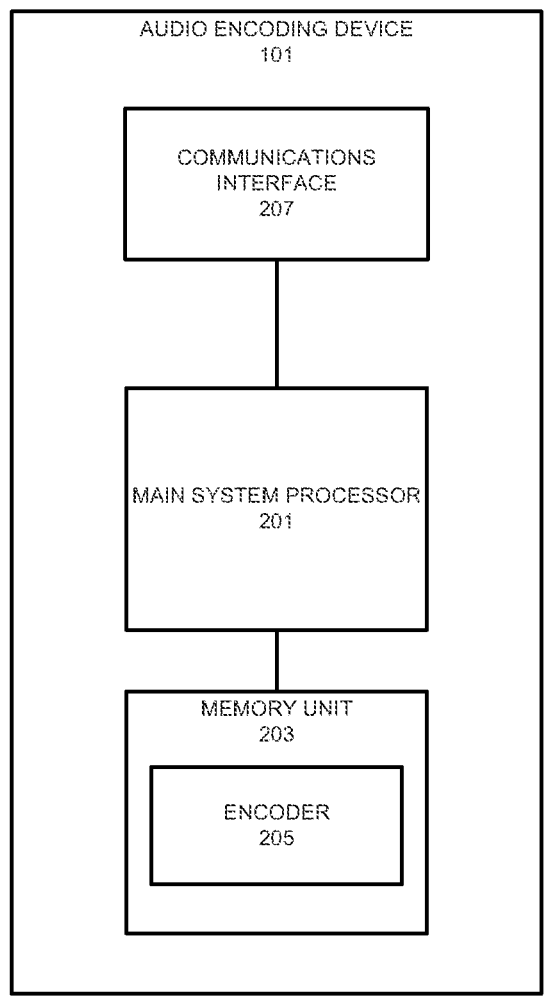
FIG. 2 shows a component diagram of the audio encoding device according to one embodiment.

FIG. 2 shows a component diagram of the audio encoding device 101 according to one embodiment. The audio encoding device 101 may be any computing device that is capable of encoding a multi-channel piece of sound program content. For example, the audio encoding device 101 may be a laptop computer, a desktop computer, a computer server, a tablet computer, a gaming system, and/or a mobile device (e.g., cellular telephone or mobile media player). Each element of the audio encoding device 101 shown in FIG. 2 will now be described.

The audio encoding device 101 may include a main system processor 201 and a memory unit 203. The processor 201 and memory unit 203 are generically used here to refer to any suitable combination of programmable data processing components and data storage that conduct the operations needed to implement the various functions and operations of the audio encoding device 101. The processor 201 may be a special purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines) while the memory unit 203 may refer to microelectronic, non-volatile random access memory.

An operating system may be stored in the memory unit 203, along with application programs specific to the various functions of the audio encoding device 101, which are to be run or executed by the processor 201 to perform the various functions of the audio encoding device 101. For example, the memory unit 203 may include an encoder 205, which in conjunction with other hardware and software elements of the audio encoding device 101, encodes a multi-channel piece of sound program content. As noted above and as will be described in further detail below, the encoded data produced by the encoder 205 may include metadata for separate channels or channel groups of the piece of sound program content. The metadata may indicate ducking values to be applied by one or more of the audio decoding devices $103_1$-$103_N$ to other channels/channel groups not associated with the metadata. In particular, as will be described in greater detail below, the ducking values may be used by one or more of the audio decoding devices $103_1$-$103_N$ to duck other channels/channel groups to improve the intelligibility to users of the non-ducked channels/channel groups.

In one embodiment, the audio encoding device 101 may include a communications interface 207 for communicating with other components over one or more connections. For example, the communications interface 207 may be capable of communicating using Bluetooth, the IEEE 802.11x suite of standards, IEEE 802.3, cellular Global System for Mobile Communications (GSM) standards, cellular Code Division Multiple Access (CDMA) standards, and/or Long Term Evolution (LTE) standards. In one embodiment, the communications interface 207 facilitates the transmission/reception of video, audio, and/or other pieces of data over the distributed network 105. For example, the audio encoding device 101 may receive one or more pieces of sound program content to be encoded via the communications interface 207. As will be described in greater detail below, the pieces of sound program content may be encoded/processed and transmitted to one or more of the audio decoding devices $103_1$-$103_N$ for playback also via the communications interface 207.

Figure 3:
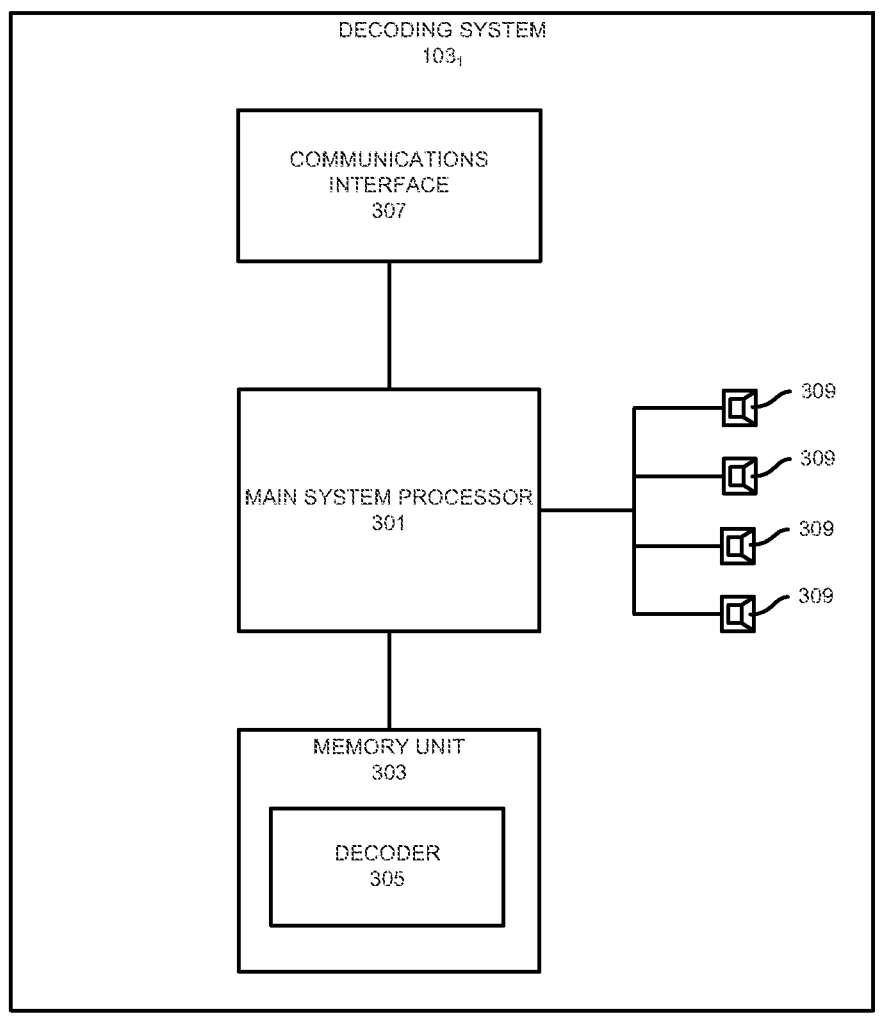
FIG. 3 shows a component diagram of the audio decoding device according to one embodiment.

Turning now to FIG. 3, the audio decoding device $103_1$ will be described. Although described in relation to the audio decoding device $103_1$, each of the audio decoding devices $103_2$-$103_N$ may include similar or identical elements. The audio decoding device $103_1$ may be any computing device that is capable of receiving, decoding, and playing back an encoded piece of sound program content. For example, the audio decoding device $103_1$ may be a laptop computer, a desktop computer, a tablet computer, a set-top box, a multimedia player, a gaming system, and/or a mobile device (e.g., cellular telephone or mobile media player). As will be described in greater detail below, the audio decoding device $103_1$ may receive an audio asset representing an encoded piece of sound program content from the audio encoding device 101. The audio decoding device $103_1$ may read/extract metadata in the encoded piece of sound program content for a particular channel/channel group. The metadata may include ducking values to be applied to other channels/channel groups. Accordingly, as noted above, these channels/channel groups that are not associated with the ducking values may be ducked using the ducking values to improve the intelligibility of non-ducked channels/channel groups.

The audio decoding device $103_1$ may include a main system processor 301 and a memory unit 303. Similar to the processor 201 and the memory unit 203, the processor 301 and the memory unit 303 are generically used here to refer to any suitable combination of programmable data processing components and data storage that conduct the operations needed to implement the various functions and operations of the audio decoding device $103_1$. The processor 301 may be a special purpose processor such as an ASIC, a general purpose microprocessor, a FPGA, a digital signal controller, or a set of hardware logic structures (e.g., filters, arithmetic logic units, and dedicated state machines) while the memory unit 303 may refer to microelectronic, non-volatile random access memory.

An operating system may be stored in the memory unit 303, along with application programs specific to the various functions of the audio decoding device $103_1$, which are to be run or executed by the processor 301 to perform the various functions of the audio decoding device $103_1$. For example, the memory unit 303 may include a decoder 305. The decoder 305, along with one or more other components of the audio decoding device $103_1$, may extract/derive ducking values from an audio asset representing the encoded piece of sound program content. For example, the ducking values may have been derived through an analysis of a primary channel group and inserted with the audio asset. The decoder 305 may extract the ducking values or apply an algorithm to an encoded version of the ducking values within the mixed signal to produce the ducking values. The decoder 305 may thereafter apply these ducking values to one or more channels/channel groups of the encoded piece of sound program content. In particular, the ducking values may be associated in the encoded piece of sound program content with a first channel/channel group and the decoder 305 may apply the ducking values to a second channel/channel group that is distinct from the first channel/channel group. Accordingly, ducking performed by the decoder 305 is relative to other channel/channel groups that are not associated with the ducking values within the audio asset instead of the channel/channel group associated with the ducking values.

In one embodiment, the audio decoding device $103_1$ may include one or more loudspeakers 309 for outputting sound based on the encoded piece of sound program content. The loudspeakers 309 may be any combination of full-range drivers, mid-range drivers, subwoofers, woofers, and tweeters. Each of the loudspeakers 309 may use a lightweight diaphragm, or cone, connected to a rigid basket, or frame, via a flexible suspension that constrains a coil of wire (e.g., a voice coil) to move axially through a cylindrical magnetic gap. When an electrical audio signal is applied to the voice coil, a magnetic field is created by the electric current in the voice coil, making it a variable electromagnet. The coil and the loudspeakers' 309 magnetic system interact, generating a mechanical force that causes the coil (and thus, the attached cone) to move back and forth, thereby reproducing sound under the control of the applied electrical audio signal coming from a source.

In one embodiment, the audio decoding device $103_1$ may include a communications interface 307 for communicating with other components over one or more connections. For example, the communications interface 307 may be capable of communicating using Bluetooth, the IEEE 802.11x suite of standards, IEEE 802.3, cellular Global System for Mobile Communications (GSM) standards, cellular Code Division Multiple Access (CDMA) standards, and/or Long Term Evolution (LTE) standards. In one embodiment, the communications interface 307 facilitates the transmission/reception of video, audio, and/or other pieces of data. For example, the audio decoding device $103_1$ may receive an audio asset representing an encoded piece of sound program content from the audio encoding device 101 via the communications interface 307. This received audio asset may be decoded and played back by the audio decoding device $103_1$ as will be described in greater detail below.

As noted above, the other audio decoding devices $103_2$-$103_N$ may be identical to the audio decoding device $103_1$. In particular, the audio decoding devices $103_2$-$103_N$ may each include a processor 301, memory unit 303, decoder 305, communications interface 307, and one or more loudspeakers 309.

As described above, the audio encoding device 101 and the audio decoding devices $103_1$-$103_N$ may communicate over the distributed network 105. The distributed network 105 may be composed of any combination of networking devices, including switches, routers, controllers, access points, etc. The distributed network may operate using one or more standards/protocols, including Bluetooth, the IEEE 802.11x suite of standards, IEEE 802.3, cellular Global System for Mobile Communications (GSM) standards, cellular Code Division Multiple Access (CDMA) standards, and/or Long Term Evolution (LTE) standards.

Figure 4:
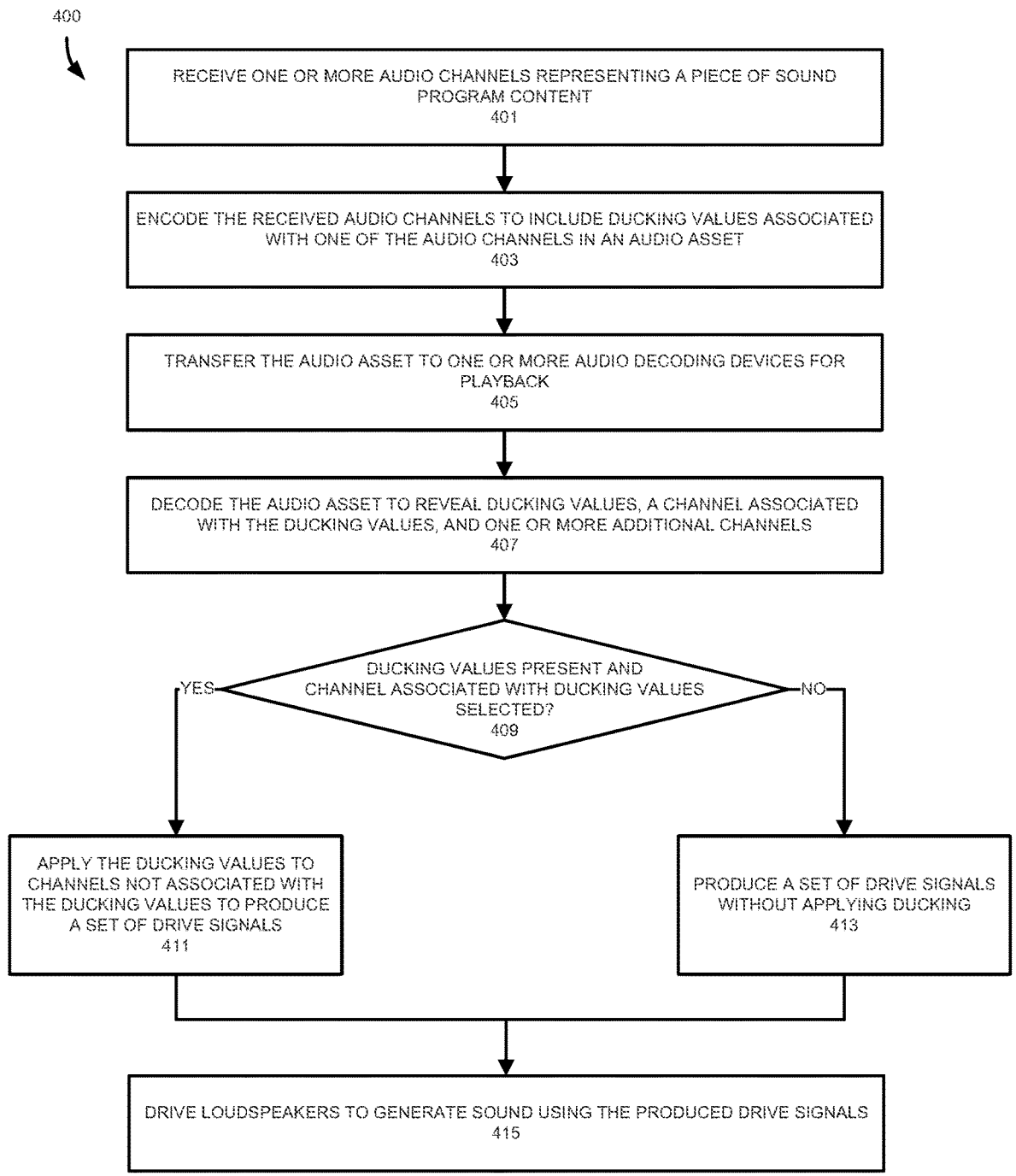
FIG. 4 shows a method according to one embodiment for (1) encoding a multi-channel piece of sound program content to include ducking values associated with a first channel/channel group and (2) playing back the encoded multi-channel piece of sound program content such that a second channel/channel group is ducked in favor of the first channel/channel group that is associated with the ducking values.

Turning now to FIG. 4, a method 400 will be described for (1) encoding a multi-channel piece of sound program content to include ducking values associated with a first channel/channel group and (2) playing back the encoded multi-channel piece of sound program content such that a second channel/channel group is ducked in favor of the first channel/channel group that is associated with the ducking values. Although the operations of the method 400 are described in relation to channels/channel groups, in other embodiments, ducking may be performed in a similar manner relative to sound objects or stems represented by the piece of sound program content.

Each operation of the method 400 may be performed by one or more components of the audio encoding device 101, one or more audio decoding devices $103_1$-$103_N$, and/or another device. For example, as will be used in the description below, one or more of the encoder 205 of the audio encoding device 101 and the decoder 305 of the audio decoding device $103_1$ may be used for performing the operations of the method 400. However, in other embodiments, different elements and devices may be used for performing the method 400. Although the encoder 205 and the decoder 305 are described as residing in the memory units 203 and 303, respectively, in other embodiments, the encoder 205 and the decoder 305 may be implemented by one or more hardware structures, including filters, arithmetic logic units, and dedicated state machines.

Although the operations of the method 400 are shown and described in a particular order, in other embodiments the operations of the method 400 may be performed in a different order. For example, one or more of the operations may be performed concurrently or during overlapping time periods. Each operation of the method 400 will now be described below by way of example.

In one embodiment, the method 400 may commence at operation 401 with the receipt of a set of audio signals representing one or more channels for a piece of sound program content. For instance, the audio encoding device 101 may receive N channels of audio corresponding to a piece of sound program content (e.g., a musical composition or a soundtrack/audio track of a movie), where N is greater than or equal to two. For example, four channels of audio representing a piece of sound program content may be received at operation 401. In some embodiments, one of the received channels may correspond to a narration channel that assists visually impaired users to understand actions taking place in a movie or television broadcast. In these embodiments, the other channels may correspond to either spatial channels (e.g., left, right, and center audio channels) and/or represent objects/stems (e.g., dialogue, music, and effects audio objects/stems). The audio signals/channels may be received at operation 401 from an external system or device (e.g., an external computer or streaming audio service) via the communications interface 207. In other embodiments, the audio signals/channels may be stored locally on the audio encoding device 101 (e.g., stored in the memory unit 203) and retrieved at operation 401.

In some embodiments, the audio signals/channels received at operation 401 may be intended for reproduction simultaneously and in sync with a video. For example, as noted above, the audio signals/channels received at operation 401 may be an audio track for a movie or television program. In this embodiment, the audio signals/channels may be transmitted and received at operation 401 along with the corresponding video content or apart from the video content.

At operation 403, the channels received at operation 401 may be processed/encoded to generate an audio asset representing the piece of sound program content. In one embodiment, channels may be grouped and processed within these groups. Each channel group may include one or more individual channels that are associated together. The channel groups may be analyzed together to determine Dynamic Range Control/Compression (DRC) gain values that are to be applied to each respective group of channels during decoding/playback of the encoded piece of sound program content. DRC reduces the volume of loud sounds or amplifies quiet sounds by narrowing or compressing an audio signal's dynamic range. The DRC gain values may be added as metadata to an audio asset representing the encoded piece of sound program content.

In one embodiment, ducking values may be determined for a single channel/channel group in the piece of sound program content. The ducking values represent the amount other channels/channel groups will be ducked (e.g., reduced in volume). For example, a piece of sound program content received at operation 401 may include four objects: (1) a narration object; (2) a dialogue object; (3) a music object; and (4) an effects object. In some embodiments, these four objects may be assigned to channel groups prior to processing (e.g., the narration object may be assigned to a first channel group, the dialogue object may be assigned to a second channel group, and the music and effects object may be both assigned to a third channel group). In this example, a set of ducking values may be generated and associated with the first channel group. The set of ducking values associated with the first channel group indicates the amount of attenuation to be applied to one or more of the other channel groups by decoders 305 in one or more of the audio decoding devices $103_1$-$103_N$.

In some embodiments, individual ducking sequences may be associated with the original layout of the channels/channel groups and each possible downmix of the channels/channel groups. For instance, an identifier may be associated with the original layout of the channels/channel groups and the each possible downmix of the channels/channel groups. In this example, separate sequences of ducking values may be associated with each identifier. Accordingly, the appropriate sequence of ducking values may be applied to the channels/channel groups based on their layout/downmix arrangement.

In one embodiment, the ducking values may be applied to channel groups by narrowing/compressing the dynamic range of these channel groups. For example, the ducking values may indicate that other channel groups may be ducked by 10 dB during playback by one or more of the audio decoding devices $103_1$-$103_N$ and may be applied similar to DRC gain values. This ducking may fluctuate over a specified time period. For instance, while detecting activity (e.g., voice or speech activity) in the first channel group during a first time period, operation 403 may set ducking values associated with the first channel group to a first level during this first time period. Conversely, upon failing to detect activity in the first channel group during a second time period, operation 403 may set ducking values associated with the first channel group to a second level during this second time period. In this example, the first level may be greater than the second level such that the second and third channel groups are more severely ducked during periods of activity in the first channel group than during periods of inactivity. Accordingly, the first channel group may be emphasized during periods of activity while allowing the second and third channel groups to be heard and unchanged during periods in which the first channel group is relatively inactive.

As noted above, the ducking values may be applied similar to DRC gain values. In these embodiments, the ducking values may be less than or equal to zero dB such that application of ducking values causes no attenuation of channel groups (i.e., during periods of inactivity in the first channel group) or attenuation of channel groups. In some embodiments, application of ducking values may override other effects indicated in the audio asset, including "clipping" or "fading" of channels/channel groups.

In some embodiments, the ducking values may indicate application of different levels of ducking to each channel group. Using the three example channel groups discussed above, operation 403 may determine that the second channel group associated with dialogue may need to be more severely ducked during playback than the third channel group associated with music and effects. This more severe ducking of dialogue allows narration in the first channel group to reside in foreground audio along with music and effects in the third channel group while dialogue in the second channel group may be played just beneath (i.e., in the background). Since dialogue may more harshly interfere with the intelligibility of narration in comparison to music and effects, allowing the separate ducking of the second and third channel groups minimizes the amount of ducking while still promoting intelligibility of narration to users.

As described above, ducking values may be used to reduce the playback level of channels/channel groups. In some embodiments, ducking values may be extended to not only alter the level of playback, but to additionally or separately change the rendering location in the sound field of channels/channel groups. For instance, using the three example channel groups described above, the ducking values added to the audio asset at operation 403 may indicate that the rendering of the second channel group is to be moved from front loudspeakers 309 to surround loudspeakers 309 during playback by the audio decoding devices $103_1$-$103_N$. This movement of channels/channel groups may be limited during a period of time. For example, movement of channels/channel groups may only be caused when activity is detected in the first channel group (e.g., the narration channel group). By moving the rendering location of channels/channel groups in the sound field, particular channels/channel groups of interest may be emphasized in relation to other channels/channel groups.

In one embodiment, the ducking values generated at operation 403 and inserted within the audio asset may be associated with a single channel/channel group. Accordingly, each audio asset includes a single channel/channel group that is not ducked during playback while all other channels/channel groups in the audio asset are ducked using the ducking values. In some embodiments, the ducking values generated at operation 403 may be associated with multiple channels/channel groups, but only one of these multiple channels/channel groups may be active for playback at a time. For instance, the audio asset may include multiple different narration channels/channel groups corresponding to different languages. In these embodiments, only one language may be selected for playback at a time (i.e., only one active channel/channel group amongst the different narration channel/channel groups). Accordingly, the ducking values are applied to all other active channel/channel groups not associated with the ducking values (i.e., ducking values not applied to active and inactive narration channel/channel groups).

In some embodiments, the audio asset may include multiple sets of ducking values that are each associated with a different channel/channel group. For instance, using the example above, the audio asset may include multiple different narration channels/channel groups corresponding to different languages with only one channel/channel group authorized to be active at a time. In this embodiment, each of the narration channels/channel groups may be associated with a different set of ducking values that will be applied to all other active channels/channel groups during playback.

Following generation of the encoded piece of sound program content, including ducking values, operation 405 may transfer the audio asset representing the piece of sound program content to one or more of the audio decoding devices 103₁-103ₙ. In one embodiment, transfer of the audio asset may be performed over the distributed network 105 using the communications interface 207 of the audio encoding device 101 and the communications interfaces 307 of the one or more of the audio decoding devices 103₁-103ₙ. In other embodiments, the audio asset may be transferred at operation 405 through other techniques (e.g., via a portable memory device).

At operation 407, the one or more of the audio decoding devices 103₁-103ₙ may decode the audio asset to reveal two or more channels/channel groups, ducking values associated within one of the channels/channel groups, and/or other audio information added at operation 403. As noted above, the ducking values may be used for (1) ducking particular channels/channel groups and/or (2) moving particular channels within the sound field.

At operation 409, the method 400 may determine if ducking values were present in the audio asset and whether the channel/channel group associated with the ducking values was selected for playback (e.g., selected for playback by a user). At operation 413, when ducking values are not included in the audio asset or channels associated with the ducking values are not selected for playback, drive signals may be generated for the channels/channel groups selected for playback without ducking. These drive signals generated at operation 413 may be used for playback through the loudspeakers 309 at operation 415.

Conversely, at operation 411, when ducking values are included in the audio asset and the associated channel/channel group has been selected for playback, the decoded ducking values may be applied to non-associated channels/channel groups to produce a set of drive signals for playback through the loudspeakers 309 at operation 415. In particular, the ducking values may reduce the dynamic range of channels/channel groups not associated with the ducking values. In the three example channel groups described above, ducking values may be applied to the second and/or third channel groups such that audio from the first channel group remains un-ducked and consequently is more intelligible to users. In some embodiments, a scale factor may be applied to the ducking values before application at operation 411.

As described above in relation to operation 403, ducking values may also cause one or more channels/channel groups not associated with the ducking values to move within the sound field. For instance, at operation 411 ducking values may cause the second channel group, in the example above, to move into surround loudspeakers 309. Along with ducking the dynamic range of the second and/or third channel groups, this movement may improve the intelligibility of the first channel group.

As described above, ducking values may be included in an audio asset representing a piece of sound program content and associated with a particular channel/channel group. During playback of the encoded piece of sound program content, the ducking values may be applied to all other channels/channel groups. This ducking may improve intelligibility of audio in the non-ducked channel/channel group. For instance, a narration channel/channel group may be more clearly heard by users through the use of selective ducking of other channels/channel groups during playback.

As explained above, an embodiment of the invention may be an article of manufacture in which a machine-readable medium (such as microelectronic memory) has stored thereon instructions which program one or more data processing components (generically referred to here as a "processor") to perform the operations described above. In other embodiments, some of these operations might be performed by specific hardware components that contain hardwired logic (e.g., dedicated digital filter blocks and state machines). Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method for encoding audio, comprising:
   encoding an audio signal having a first channel group and a plurality of remaining channel groups; and
   providing a ducking gain sequence that is associated with i) the first channel group which comprises a narration channel, or ii) a base channel layout or a downmix identifier wherein the downmix identifier controls inclusion of the first channel group for playback, wherein the ducking gain sequence and the downmix identifier are part of metadata associated with the encoded audio signal, and wherein the ducking gain sequence overrides a fading effect associated with the encoded audio signal.

2. The method of claim 1 further comprising providing a ducking adjustment parameter as part of the metadata.

3. The method of claim 1 wherein the metadata has no more than one ducking gain sequence per downmix identifier or base channel layout.

4. A method for decoding audio, comprising:
   receiving an encoded audio signal;
   receiving metadata associated with the encoded audio signal, wherein the metadata contains a ducking sequence that is associated with i) a first channel group which comprises a narration channel or ii) a base channel layout or a downmix identifier;
   decoding the encoded audio signal to produce a decoded audio signal that has the first channel group and a plurality of remaining channel groups; and
   when including the first channel group for playback;
   if the metadata indicated that the ducking sequence is associated with the first channel group, then applying the ducking sequence to the plurality of remaining channel groups, and not the first channel group, of the decoded audio signal; and if the metadata indicates that the ducking sequence is associated with the downmix identifier, then applying the ducking sequence to all channels except the narration channel.

5. The method of claim 4 wherein the received metadata contains a ducking adjustment parameter, the method further comprising adjusting at least part of the ducking sequence in accordance with the ducking adjustment parameter, prior to applying the ducking sequence to the remaining channel groups.

6. The method of claim 4 wherein the metadata has no more than one ducking sequence per downmix identifier or base channel layout contained in the metadata.

7. A method for encoding a piece of sound program content, comprising:

determining that a first channel group, object or stem that comprises a narration channel in the piece of sound program content is to be foreground while a second channel group, object or stem in the piece of sound program content is to be background during playback of the piece of sound program content, wherein the piece of sound program content has a plurality of channel groups, objects or stems that include the first channel group, object or stem and the second channel group, object or stem, wherein a channel group is one more channels;

detecting activity in the first channel group, object or stem during a first time period of the piece of sound program content, and in response generating a sequence of time varying ducking values to apply to the second channel group, object or stem during the first time period in the piece of sound program content, the ducking values overriding other effects associated with the piece of sound program content;

associating the ducking values with the first channel group, object or stem; and encoding the sound program content and metadata in an audio asset, wherein the encoded sound program content includes the first channel group, object or stem and the second channel group, object or stem, and the metadata includes the sequence of time varying ducking values that are associated with the first channel group, wherein the ducking values cause the second channel group, object or stem to change rendering location in a sound field during playback.

8. The method of claim 7 wherein the ducking values vary over time based on activity within the first channel group, object or stem such that during periods of high activity within the first channel group, the ducking values provide more ducking of the second channel group, object or stem during playback than during low activity within the first channel group, object or stem.

9. The method of claim 7 wherein the ducking values are generated to also apply to a third channel group, object or stem in the piece of sound program content, wherein separate sets of ducking values are generated for the second channel group, object or stem and the third channel group, object or stem so that the second channel group, object or stem is de-emphasized differently than the third channel group, object or stem.

10. The method of claim 7 wherein the ducking values when applied to the second channel group, object or stem do not cause dynamic range compression of the second channel group, object or stem during playback.

11. The method of claim 7 wherein the ducking values are gain values less than or equal to zero decibels that when applied to the second channel group, object or stem attenuate sound associated with the second channel group, object or stem.

12. The method of claim 7 wherein each of multiple groupings of channels, objects or stems is associated with a separate identifier and a corresponding set of ducking values such that an appropriate set of ducking values is associated with a corresponding set of channel groups, objects or stems.

13. An audio system comprising:

a processor; and memory having stored therein instructions that program the processor to decode a piece of sound program content, wherein the processor becomes programmed to receive an audio asset containing the piece of sound program content having i) one or more channel groups, objects, or stems that include a first channel group, object or stem and a second channel group, object or stem, wherein a channel group is one or more channels, receive metadata associated with the piece of sound program content, wherein the metadata has a ducking gain sequence of time varying ducking values that are associated with the first channel group, object or stem, wherein the time varying ducking values have been generated based on detected activity within the first channel group, object or stem, extract the ducking values;

extract the first channel group, object or stem and the second channel group, object or stem;

extract a downmix identifier from the metadata, scan a plurality of available gain sequences in the metadata to identify one of the plurality of available gain sequences as the ducking gain sequence of time varying ducking values; and apply the time varying ducking values to the second channel group, object or stem during playback of the piece of sound program content to thereby make the second channel group, object or stem less prominent.

14. The audio system of claim 13 wherein the metadata has no more than one ducking gain sequence per downmix identifier specified in the metadata.

15. The audio system of claim 13 wherein the metadata includes a plurality of available gain sequences that include a fading gain sequence and a ducking gain sequence, and wherein when a ducking control bit is set in the metadata the fading gain sequence is not applied to the piece of sound program content.

16. An apparatus, comprising a processor configured to perform the following: encoding an audio signal having a first channel group and a plurality of remaining channel groups; and providing a ducking gain sequence that is associated with i) the first channel group which comprises a narration channel, or ii) a base channel layout or a downmix identifier wherein the downmix identifier controls inclusion of the first channel group for playback, wherein the ducking gain sequence and the downmix identifier are part of metadata associated with the encoded audio signal, and wherein the ducking gain sequence overrides a fading effect associated with the encoded augio signal.

17. The apparatus of claim 16, wherein a ducking adjustment parameter is included as part of the meta data.

18. The apparatus of claim 16, wherein the metadata has no more than one ducking gain sequence per downmix identifieror base channel layout.

19. The apparatus of claim 16, wherein the ducking gain sequence does not cause dynamic range compression when applied.

20. The apparatus of claim 16, wherein the metadata includes a fading gain sequence.

* * * * *